PARAMETRIC SWITCHING CIRCUIT AMPLIFIER

Filed March 29, 1957 2 Sheets-Sheet 1

INVENTOR
GEORGE ABRAHAM

BY W R Mattox
Richard C Beal
ATTORNEYS

PARAMETRIC SWITCHING CIRCUIT AMPLIFIER

Filed March 29, 1957 2 Sheets-Sheet 2

INVENTOR
GEORGE ABRAHAM

BY W R Maltby
Richard C Reed
ATTORNEYS

United States Patent Office 2,912,599
Patented Nov. 10, 1959

2,912,599

PARAMETRIC SWITCHING CIRCUIT AMPLIFIER

George Abraham, Washington, D.C.

Application March 29, 1957, Serial No. 649,573
1 Claim. (Cl. 307—88.5)
(Granted under Title 35, U.S. Code (1952), sec. 266)

The invention described herein may be manufactured and used by or for the Government of the United States of America for governmental purposes without the payment of any royalties thereon or therefor.

The present invention relates in general to an electrical signal generating circuit and in particular to a multivibrator-amplifier circuit.

In the field of electronics, a multivibrator circuit may find many useful applications. By way of example, in a counter, a plurality of multivibrator circuits, connected in tandem, may be used when it is desired to count pulses occurring either at regular intervals or at random. At present, in order to have a multivibrator circuit followed by an amplifier circuit, it is necessary to have two vacuum tubes in the multivibrator circuit and a third vacuum tube in the amplifier circuit, or in short, three active devices are required. If transistors are employed a first transistor is used in the multivibrator circuit and a second transistor is used in the amplifier circuit or, at the very least, two active devices are required. Thus, if several multivibrator-amplifier circuits are utilized in a single counter, the physical size and weight of the counter will be appreciable. If electron tubes are used, the power consumption will be high and a large portion of the power supplied to the counter, because of the low efficiency, will be dissipated as heat.

In accordance with the foregoing, it is an object of the present invention to provide an arrangement having a multistable circuit followed by an amplifier circuit that requires a minimum number of circuit elements and a negligible amount of power.

Another object of the present invention is to provide a circuit in which a single solid state device may be used in common with a multivibrator circuit and an amplifier circuit.

Another object of the present invention is to provide an arrangement in which a solid state device having three elements is connected so that the first and second elements operate in a multivibrator circuit while at the same time the second and third elements operate in an amplifier circuit.

Another object of the present invention is to provide an arrangement in which a source of pulses is connected across a first element and a third element of a slab of material so that the arrangement will function as a multivibrator and in which an output circuit is connected across a second element and the third element so that the arrangement will function as an amplifier.

Other objects and many of the attendant advantages of this invention will be readily apparent as the same become better understood by reference to the following detailed description when considered in connectin with the accompanying drawings, wherein Fig. 1 discloses a typical embodiment of the present invention;

Figure 1:
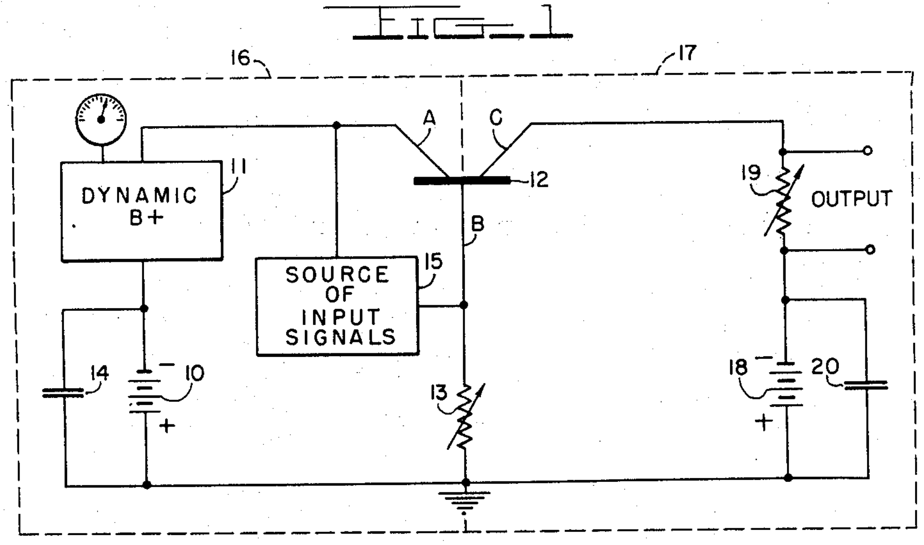
Figure 5:
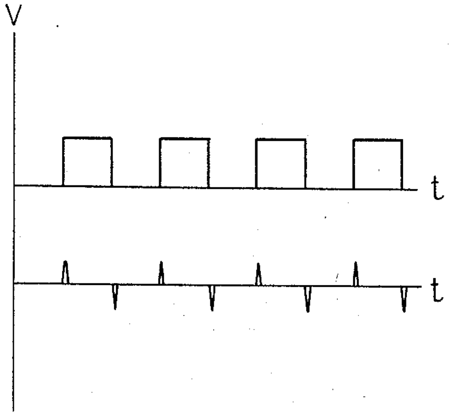
Figure 6:
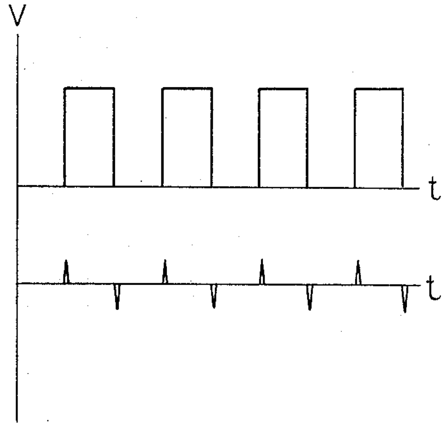

Fig. 5 shows the voltage-time characteristic of the output of the multivibrator portion of the arrangement shown in Fig. 1 when the circuit shown in Fig. 1 is triggered on and off by the pulses whose voltage-time characteristics are also shown in Fig. 5; and Fig. 6 shows the voltage-time characteristic of the output of the amplifier section of the arrangement shown in Fig. 1 when the arrangement is triggered on and off by a series of pulses whose voltage-time characteristic is also shown in Fig. 6.

As used in the present application, source of pulses is defined as a continually varying potential applied to a selected nonlinear device to store energy therein and to enable the device to function as an amplifier and/or to exhibit a negative resistance characteristic. As an example, a source of pulses may be a source of recurring signals providing signals having a frequency or repetition rate greater than the reciprocal of the lifetime of electrical charge carriers injected into the variable impedance device to which the source of pulses is connected.

In the present invention, as indicated below, a constant voltage, square wave generator is used as a source of pulses. It is understood, however, that the source of pulses may be any source of recurring signals so long as the frequency or repetition rate of the recurring signals is greater than the reciprocal of the lifetime of injected electrical charge carriers and so long as element A connected to slab of material 12, shown in Fig. 1, is driven positive during one portion of a cycle of operation and negative during another portion of the cycle with respect to a reference potential.

In accordance with the present invention, a signal generating circuit is provided wherein a source of pulses is connected in series with the first and third elements of the slab of material having three elements, and an output circuit is connected to the second and third elements of the slab of material. The source of pulses injects minority electrical charge carriers into the slab of material at a rate greater than the rate at which the electrical charge carriers decay due to recombination to maintain a steady state of electrical charge carriers in the slab of material. The stored electrical charge carriers are used to obtain a negative resistance curve having two regions in which stable states of operation may be located. The portion of the signal generating circuit that includes the source of pulses and the first and third elements of the slab of material may, therefore, be controlled as a bistable circuit. The bistable circuit may be triggered from one stable state to another by a source of input signals connected between the first and third elements. For example, triggering from a first stable state to a second stable state may be accomplished by applying a pulse of proper polarity and proper amplitude for a given load line to a desired element of the slab of material and a pulse of reverse polarity and the same amplitude will trigger the bistable circuit from the second to the first stable state. The circuit connected between the second and third elements functions as an amplifier to amplify the pulses derived when the multivibrator portion of the signal generating circuit is triggered from one stable state to another. In this way the signal generating circuit employs a slab of material which functions in part in a multivibrator circuit and also functions in part in an amplifier circuit.

Referring to Fig. 1, the typical embodiment of the signal generating circuit shown therein comprises a source of direct current voltage 10 connected in series with a source of pulses 11, a slab of material 12 having elements A, B, and C and a variable resistor 13. A capacitor 14 is connected across the source of direct current voltage. A source of input signals 15 is connected between the elements A and B of the slab of material. It is noted that the source of pulses 11 may be controlled manually by knob 11A to vary such parameters as frequency, phase, duration and magnitude. Element A serves a dual capacity as an emitter and collector on a time sharing basis. In the time interval during which the element is forward biased, element A functions as an emitter injecting minority charge carriers; the impedance between elements A and B is relatively low. In the following time interval when element A is reverse-biased, it serves as a collector; and the impedance between the elements is relatively high.

The above-mentioned elements which are included in dotted box 16 comprise the multivibrator of the signal generating circuit. On the right hand side of the figure, dotted box 17 is shown wherein a source of direct current voltage 18 is connected in series with a variable resistor 19 and the slab of material 12 and variable resistor 13. A capacitor 20 is connected across the source of direct current voltage 18. The output is taken across variable resistor 19. The elements included in the dotted box 17 comprise the amplifier portion of the signal generating circuit shown in this embodiment of the invention.

The slab of material 12 may be fabricated of any suitable material wherein two or more electrical charge carriers having appropriate lifetimes are operative. For example, the N-type or P-type material used in the conventional point contact or junction type transistor may be used. The base material should have a conductivity somewhere within the range of approximately 2 to 10 ohm-cm. The dimensions of the slab are not critical. The spacing between the elements should be short compared to the diffusion length, the only limitation being that they should not be so close together as to create the danger of shorting. In a typical device the spacing between elements may be of the order of 4 to 6 mils. The elements may be formed or connected to the slab of material by existing methods, for example, by battery capacitor discharge techniques. Each element is formed separately to give a reverse impedance within the range of approximately 5,000 to 15,000 ohms. The electrical charge carriers will be positive or negative charge carriers depending upon whether the material is N-type or P-type respectively. The source of pulses may be any source of recurring signals so long as the frequency or repetition rate of the recurring signals is greater than the reciprocal of the lifetime of injected electrical charge carriers and so long as one element of the slab of material is driven positive with respect to another element of the slab of material during each cycle of operation. The load impedance will depend upon the internal impedance of the slab and for a typical device will be of the order of 10,000 to 15,000 ohms.

As indicated above, the semiconductor device comprising slab of material 12 and elements A, B, and C may be fabricated in any number of conventional ways such as forming alloying, diffusing, jet etching, etc. Consider, for example, the case of forming. Elements A and C, each a catwhisker of Phosphor bronze ground to a cross-sectional area of less than a mil, are placed 3 to 4 mils apart in pressure contact with a slab of arsenic or antimony doped germanium. The resistivity of the germanium may be approximately 5 ohm-cm. Low-current surges are passed through each junction comprising a catwhisker and the slab converting into p-type material a small volume of germanium around the point of the catwhisker, thereby establishing a p-n junction. The low-current surges are applied until elements A and C exhibit good collector efficiency and their impedances are substantially equal over the reverse characteristic. Thus, as a result of the forming process, elements A and C will have efficient collector characteristics and in addition element A will have high injection efficiency.

In the present embodiment shown in Fig. 1, a constant voltage, square wave generator is used as a source of pulses (a typical operating point is 1 mc. with a 50% duty cycle), the slab of material is of N-type material, and therefore the injected electrical charge carriers are holes. Other types of signals could be used in combination with a selected slab of material to maintain a steady state of electrical charge carriers. For example, a high frequency, sine wave oscillator could be used to inject and store electrons in a slab of P-type material.

In the operation of the signal generating circuit shown in Fig. 1, the source of pulses is applied to the slab of material 12; and after a few cycles of operation, the number of holes stored in the slab of material reaches a steady state. Signals are then applied by the source of input signals 15 to either element A or B of the slab to trigger the multivibrator circuit shown in dotted box 16 from one stable state to another. The output of the multivibrator is amplified by the elements shown in dotted box 17 to derive an amplified output signal across variable resistor 19.

In order to understand the operation of the multistable circuit shown in Fig. 1, it is necessary to appreciate the relationship between several factors that affect the number of holes stored in the steady state. These factors may be listed as follows: the impedance of the slab of material, the load impedance, the bias, and the parameters of the pulses such as frequency, magnitude, phase and duration.

As indicated, the number of holes that will be stored in N-type base material of a slab of material will be determined in part by the internal impedance of the slab, i.e. by the barrier capacitance, barrier resistance, base capacitance and base resistance of the slab of material. As will be explained presently, the impedance of the slab is not static but varies with or is modulated by the pulses applied to the slab of material.

The impedance of the slab is dependent in part on such factors as the lifetime of the electrical charge carriers and diffusion length in the material of the slab. These factors in turn are determined by the material used and the process of manufacturing the slab. The internal impedance is also dependent in part on the conditions under which the slab of material is operated in a particular circuit. This will become apparent during the analysis of Figs. 2A, 2B and 2C which, it will be recalled, represent the equivalent circuit of a slab of material before, during and immediately after the application of pulses.

Figure 2A:
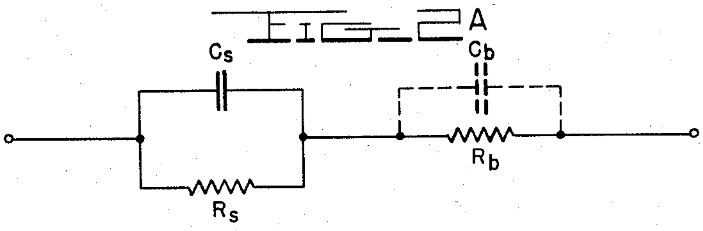
Fig. 2A represents the equivalent circuit of a slab of material before a source of pulses is applied.

Referring to Fig. 2A, when no pulses are applied to the slab, if the material of the slab is of N-type material having 5 ohm-cm. conductivity, the value of the barrier capacitance Cs will be approximately 3 micromicrofarads, the value of the barrier resistance Rs will be approximately 5,000 ohms, the base capacitance $C_b$ will be less than 0.2 micromicrofarad which normally may be neglected and the base resistance $R_b$ will be approximately 100 ohms in point contact units. The value of each impedance will be determined in part by the material used and the process of manufacture of the slab.

Figure 2B:
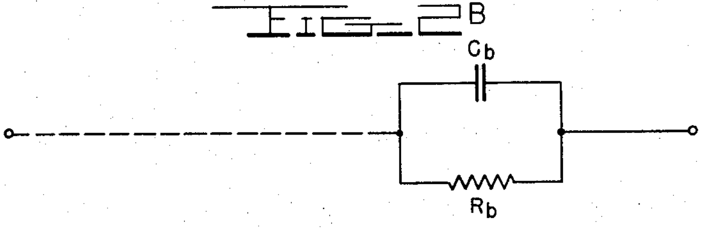
Fig. 2B represents the equivalent circuit of the slab of material during the application of a source of pulses.

In the preferred embodiment of the present invention, a large magnitude of square wave energy is applied to the slab of material. As the pulse increases to its positive maximum value, there is considerable diffusion of electrical charge carriers into the base, and the value of the base capacitance $C_b$ becomes relatively large, approximately 350 micromicrofarads. The base resistance $R_b$ becomes smaller, approximately 60 ohms. As shown in Fig. 2B, these values cannot be neglected. The barrier capacitance $C_s$, because of the increased storage of electrical charge carriers, becomes larger, approximately 200 micromicrofarads but the barrier resistance $R_s$ approaches zero, shunting out the increased barrier capacitance $C_s$. The barrier capacitance $C_s$ and barrier resistance $R_s$ may, therefore, be neglected as shown in Fig. 2B.

Figure 2C:
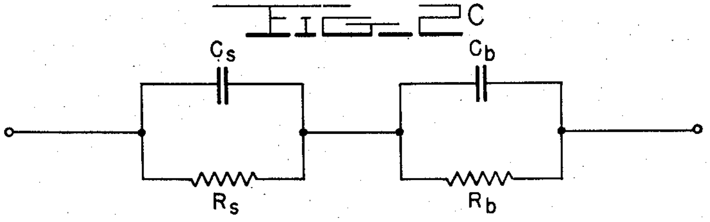
Fig. 2C represents the equivalent circuit of the slab of material immediately after the pulses have been removed.

As shown in Fig. 2C, when the pulse goes to zero, the barrier capacitance $C_s$ rapidly returns from the larger value of 200 micromicrofarads to smaller value of 3 micromicrofarads and the barrier resistance $R_s$ rapidly returns from approximately zero to 100 ohms. The base resistance $R_b$, however, returns slowly from the smaller value of 60 ohms to the larger value of 100 ohms and the base capacitance $C_b$ returns slowly from the larger value of 350 micromicrofarads to the smaller value of 0.2 micromicrofarad. Before the base capacitance $C_b$ can attain the smaller value another pulse is applied to the slab of material to return the base capacitance $C_b$ to its larger value. If a series of pulses are applied to the slab at a frequency greater than the reciprocal of the lifetime of the injected electrical charge carriers, after a few cycles of operation, the base capacitance $C_b$ will attain an average value. The number of electrical charge carriers stored in the base capacitance $C_b$ will likewise attain an average value of stored steady state that will be dependent in part upon the magnitude, duration, and frequency of the series of pulses applied to the slab of material.

Since the static base capacitance and static base resistance of a slab of material are nonlinear, the quiescent value of the base resistance and capacitance are dependent upon the bias applied to the slab of material. The dynamic base capacitance and resistance characteristics of the slab of material are likewise nonlinear and deviate in shape from the curves from the respective static characteristics. The shape of the dynamic curves will also be dependent upon the dynamic operating conditions such as the number of holes stored in the steady state, the load and bias applied to the slab as well as the characteristics of the slab of material itself. For example, the steepness of the dynamic base capacitance will be increased for a given bias as the number of holes stored in the steady state is increased and as the series of pulses is applied to the slab, the base capacitance and resistance vary in dependency on the magnitude of the pulses. Similar relationships exist between the magnitude of the pulses and the dynamic barrier capacitance and resistance of the slab. These relationships determine in part the magnitude of the steady state as explained in connection with Figs. 2A, 2B, 2C.

The number of electrical charge carriers stored in the steady state is dependent in part on the value of the load impedance and consequently may be varied by changing the value of load impedance. Hence, in Fig. 1 the magnitude of the steady state may be controlled by variable impedance 13.

The number of electrical charge carriers stored in the steady state will affect the shape and voltage current characteristic curve of the slab of material in the circuit shown in Fig. 1.

Figure 3:
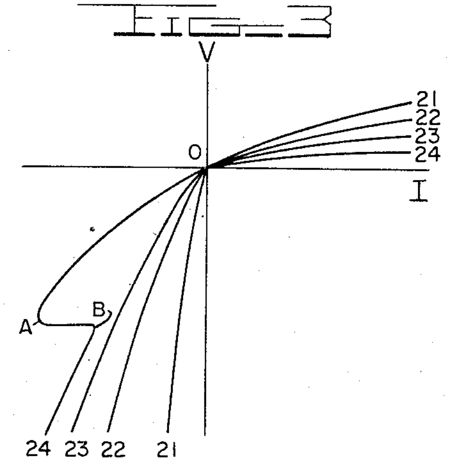
Fig. 3 represents a family of voltage-current characteristic curves of the slab of material shown in Fig. 1.

Referring to Fig. 3, curve 21 represents the voltage current characteristic curve of slab of material 12 when the magnitude of the pulse applied to the slab is zero. Curve 22 represents the voltage-current characteristic when a pulse having a relatively small magnitude is applied and curves 23 and 24 represent the voltage-current characteristic when the relative magnitude of the pulse is increased, the magnitude of the pulse applied to obtain curve 23 being greater than the magnitude applied to obtain curve 22. It is noted that as the magnitude of the pulse is increased the number of holes increases and the conductivity of the slab of material increases, i.e. the current flow through the slab, per unit of voltage applied, increases. This is attributed to positive feedback or regeneration in the slab and in the junction between the element connected to the slab and the source of pulses 11. Thus, in the circuit shown in Fig. 1, as the magnitude of the pulses is increased, the number of stored electrical charge carriers is increased and curve 21 assumes the position of curve 23. As the voltage drop across the slab of material increases further a portion of curve 23 assumes the position OA of curve 24 and as the voltage across the slab of material increases still further the portion of the negative resistance portion AB of curve 24 develops.

Similar results could be obtained by maintaining the magnitude of the pulses constant and changing another factor that controls the number of minority electrical charge carriers stored, such as, the duration or frequency of the series of pulses.

Figure 4:
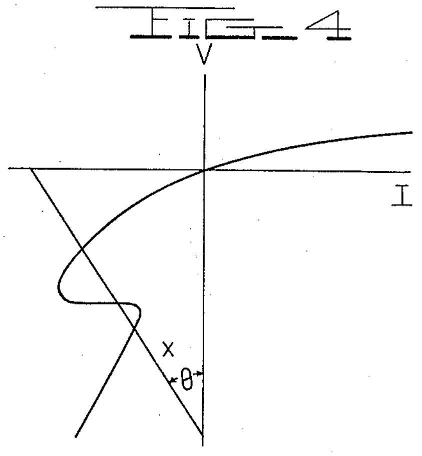
Fig. 4 shows a load line drawn on a negative resistance curve obtained for the slab of material in the circuit shown in Fig. 1.

Referring to Fig. 4, it is noted that the load line X is drawn on the negative resistance curve of the multivibrator circuit shown in Fig. 1. Load line X is drawn through a point on the voltage ordinate in Fig. 4 that is determined by the bias applied across the slab and the junction of the element connected to the slab by the source of direct current voltage 10 at an angle whose cotangent is equal to the load on the junction and on the slab. In this case the load may be considered as the value of variable resistor 13, assuming that all other impedances in the circuit are negligible compared to the junction and slab impedances. It is noted that the load line X intersects the negative resistance curve in regions where the slope of the curve is negative as well as positive. The points of intersection in the positive region represent stable states of operation for the multivibrator circuit shown in Fig. 1. It is readily apparent, therefore, that the multivibrator shown in Fig. 1 may be triggered from a first to a second stable state by applying a voltage of predetermined polarity and magnitude to element A and the multivibrator may be triggered from the second to the first stable state by applying a voltage of the same magnitude but of reverse polarity to element B. The multivibrator may, likewise, be triggered by varying the slope of load line X or by varying the phase, duration of signals applied to the slab, by varying the bias, or by varying the frequency, phase or duration of the series of pulses applied to the slab of material. If the value of the load line is greater than the magnitude of the negative resistance the multivibrator shown in dotted box 16 may be operated as either a monostable or a bistable multivibrator depending upon the selected value of the load impedance. If the value of the load impedance is less than the magnitude of the negative resistance the circuit shown in the box 16 in Fig. 1 may be operated as an astable device.

As indicated above, the portion of the signal generating device shown in the dotted box 17 in Fig. 1 functions as an amplifier. The operation of this portion of the circuit is similar to the action that takes place in the collector of a conventional point contact transistor when operated in a conventional amplifier circuit.

Referring to Figs. 5 and 6, the square wave in Fig. 5 represents the output signal of the multivibrator in dotted box 16, and the square wave in Fig. 6 represents the signal appearing in the output of the amplifier in dotted box 17. A comparison of these figures indicates that the output that would be obtained from the multivibrator, taken by itself, is much smaller than the output obtained from the combination multivibrator-amplifier arrangement shown in Fig. 1. The magnitude of output voltage shown in Fig. 5 is comparable to the output voltage that would be obtained from a conventional flip-flop circuit and the magnitude of the output voltage in Fig. 6 is comparable to the output that would be obtained from a conventional multivibrator followed by a stage of amplification.

It should be understood, of course, that the foregoing disclosure relates to only a preferred embodiment of the present invention and that it is intended to cover all changes and modifications of the example of the invention herein chosen for the purposes of disclosure, which do not constitute departures from the spirit and scope of the invention.

What is claimed is:

The method of providing an amplified signal across an output circuit connected to the second and third element of a slab of material having a first element, a second element and a third element, comprising the steps of applying a series of alternating potential pulses to the first element of said slab such that the first element is driven positive with respect to said second element during each cycle of operation, whereby minority charge carriers are injected into said slab, said series of pulses being so closely spaced that the number of minority charge carriers injected by a pulse in said series does not decrease substantially before the next pulse of said series is applied to said first element, whereby a voltage-controlled negative resistance effect appears, and applying an input signal having a selected magnitude and polarity across said first element and said second element whereby said input signal is amplified and developed across said output circuit.

References Cited in the file of this patent

UNITED STATES PATENTS

| | | |
|---|---|---|
| 2,594,449 | Kircher | Apr. 29, 1952 |
| 2,595,208 | Bangert | Apr. 29, 1952 |
| 2,600,500 | Haynes et al. | June 17, 1952 |
| 2,627,039 | MacWilliams | Jan. 27, 1953 |
| 2,627,575 | Meacham et al. | Feb. 3, 1953 |
| 2,644,892 | Gehman | July 7, 1953 |
| 2,644,893 | Gehman | July 7, 1953 |
| 2,666,816 | Hunter | Jan. 19, 1954 |
| 2,691,073 | Lowman | Oct. 5, 1954 |
| 2,708,720 | Anderson | May 17, 1955 |